United States Patent
Franz et al.

(10) Patent No.: US 12,245,401 B2
(45) Date of Patent: Mar. 4, 2025

(54) DISCONNECTS

(71) Applicant: HEWLETT PACKARD ENTERPRISE DEVELOPMENT LP, Spring, TX (US)

(72) Inventors: John Franz, Houston, TX (US); Harvey Lunsman, Chippewa Falls, WI (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 18/330,599

(22) Filed: Jun. 7, 2023

(65) Prior Publication Data
US 2023/0320032 A1 Oct. 5, 2023

Related U.S. Application Data

(62) Division of application No. 16/876,804, filed on May 18, 2020, now Pat. No. 11,711,907.

(51) Int. Cl.
| | |
|---|---|
| *F16L 37/28* | (2006.01) |
| *F16L 37/34* | (2006.01) |
| *G06F 1/20* | (2006.01) |
| *H05K 7/20* | (2006.01) |

(52) U.S. Cl.
CPC .......... *H05K 7/20272* (2013.01); *F16L 37/28* (2013.01); *F16L 37/34* (2013.01); *G06F 1/20* (2013.01); *H05K 7/20763* (2013.01); *G06F 2200/201* (2013.01)

(58) Field of Classification Search
CPC .......... F16L 37/10; F16L 37/28; F16L 37/34; H05K 7/20272; H05K 7/20763; G06F 1/20; G06F 2200/201
See application file for complete search history.

(56) References Cited

U.S. PATENT DOCUMENTS

| | | | |
|---|---|---|---|
| 1,210,090 A | 12/1916 | Markham | |
| 4,793,637 A * | 12/1988 | Laipply | F16L 37/0987 285/39 |
| 4,886,301 A * | 12/1989 | Remsburg | F16L 37/56 285/39 |
| 4,982,736 A | 1/1991 | Schneider | |

(Continued)

FOREIGN PATENT DOCUMENTS

| | | |
|---|---|---|
| CN | 208724302 U | 4/2019 |
| CN | 110778828 A | 2/2020 |

OTHER PUBLICATIONS

Data server producer use modular no-spill coupling for cooling (Web Page), Retrieved May 7, 2020, 3 Pgs.

*Primary Examiner* — Hailey K. Do
(74) *Attorney, Agent, or Firm* — Hewlett Packard Enterprise Patent Department

(57) ABSTRACT

A non-circular disconnect, comprising: a male body to insert into a non-circular female disconnect; a male poppet, wherein: when the non-circular disconnect is not inserted into the non-circular female disconnect, the male poppet is held in place, via spring force, at an opening of the non-circular male body to create a seal to prevent leakage; and when the non-circular disconnect is inserted into the non-circular female disconnect, the male poppet is pushed inwards, to allow for liquid to flow through the non-circular disconnect, by a plunger in the non-circular female disconnect.

20 Claims, 10 Drawing Sheets

(56) References Cited

U.S. PATENT DOCUMENTS

| | | | |
|---|---|---|---|
| 5,494,074 A * | 2/1996 | Ramacier, Jr. | F16L 37/0841 |
| | | | 285/317 |
| 5,653,475 A * | 8/1997 | Scheyhing | F16L 37/144 |
| | | | 285/379 |
| 6,423,053 B1 * | 7/2002 | Lee | A61M 39/1011 |
| | | | 604/905 |
| 7,050,299 B2 | 5/2006 | Kondo et al. | |
| 7,191,798 B2 | 3/2007 | Edelman et al. | |
| 8,164,902 B2 | 4/2012 | Matsushima et al. | |
| 8,608,207 B2 * | 12/2013 | Boraas | F16L 37/23 |
| | | | 285/124.3 |
| 9,848,514 B2 | 12/2017 | Shelnutt et al. | |
| 10,609,840 B2 | 3/2020 | Gao et al. | |
| 2001/0039439 A1 | 11/2001 | Elkins et al. | |
| 2006/0065874 A1 | 3/2006 | Campbell et al. | |
| 2007/0025695 A1 | 2/2007 | Kim et al. | |
| 2007/0169825 A1 | 7/2007 | Packham et al. | |
| 2008/0129047 A1 | 6/2008 | Blivet et al. | |
| 2008/0143098 A1 | 6/2008 | Zimmermann et al. | |
| 2018/0131128 A1 | 5/2018 | Franz et al. | |
| 2020/0011617 A1 | 1/2020 | Schlottig et al. | |
| 2020/0032941 A1 | 1/2020 | Tiberghien et al. | |

\* cited by examiner

DISCONNECTS

BACKGROUND

A Liquid disconnect may provide, from a tube or pipe connected to the liquid disconnect, liquid to a computing device to cool various components within the computing device. Another liquid disconnect may allow, via a tube or pipe, for liquid to flow out of the computing device, for example to a cooling distribution unit or some other facility equipment utilized to cool heated liquid. The liquid disconnect may be round. The Liquid disconnects may be round to evenly distribute pressure created from the liquid passing through the tubes or pipes to the liquid disconnect. Round liquid disconnects may fit in some spaces. However, the liquid disconnect may not be less than a set diameter. The diameter may be set to ensure proper flow rate in relation to pressure. Based on the set diameter, liquid disconnects may not fit in some applications.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

FIGS. 7A-D are schematic views of ganged disconnects, according to an example.

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

A Liquid disconnect may provide, from tubes or pipes connect to the liquid disconnect, liquid to a computing device to cool various components within the computing device. Another liquid disconnect may allow, via tubes or pipes, for liquid to flow out of the computing device, for example to a cooling distribution unit or some other facility equipment utilized to cool heated liquid. The liquid disconnect may be round. The Liquid disconnects may be round to evenly distribute pressure created from the liquid passing through the tubes or pipes to the liquid disconnect. Round liquid disconnects may fit in some spaces. However, the liquid disconnect may not be less than a set diameter. The diameter may be set to ensure proper flow rate in relation pressure drop. Based on the set diameter liquid disconnects may not fit in some applications. Further, increasing the diameter of the liquid disconnect may prevent the liquid disconnect from fitting in different areas of a computing device.

For example, the smaller a liquid disconnect is, the lower the flow rate in relation to higher pressure becomes. However, due to limited space on computing devices, the size of the liquid disconnect is constrained. In other words, liquid disconnects may be so large before the liquid disconnect would no longer fit on a computing device. In other examples, a liquid disconnect proportioned to allow for a proper flow rate in relation to pressure may not fit on some computing devices.

Based on the issues described above, a solution is to change the shape of the liquid disconnect. The shape (for example, an obround shape) may not offer the uniformity of a circular shape, which may cause deformation of the liquid disconnect, depending on the material the disconnect is comprised of, the thickness of the material, and the pressure of the fluid flowing through the liquid disconnect. However, any potential deformations may be prevented via a sleeve or other support structure. In other examples, the material may be suitable in and of itself to prevent deformation. Further, flow rate may be increased due to the shape. Further still, the flow rate may increase at a lower pressure than as with a round liquid disconnect. Such an increase in flow rate versus pressure may be attributed to the larger area of a non-circular disconnect. Further, while the height of the non-circular disconnect may be decreased to fit into smaller spaces, the width may be increased, creating a larger total area than a round or circular disconnect (thus maintaining or increasing flow rate per pressure drop).

Figure 1:
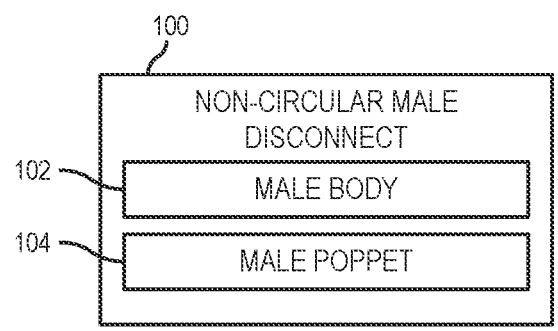
FIG. 1 is a block diagram of a male disconnect, according to an example.

FIG. 1. Is a block diagram of a male disconnect, according to an example. In an example, the male disconnect may be a non-circular male disconnect 100. In another example, the disconnect may be two ganged or fused circular disconnects. In an example, the non-circular male disconnect 100 may include a male body 102. In an example, the male body 102 may fit into a corresponding non-circular female disconnect. In another example, the non-circular male disconnect 100 may include a male poppet 104. In an example, when the non-circular male disconnect 100 is inserted into a non-circular female disconnect, the male poppet 104 may be pushed inwards (in other words, away from the non-circular female disconnect). In such examples, when the male poppet 104 is pushed in, liquid or coolant may flow through the non-circular male disconnect 100 and around the male poppet 104 to the non-circular female disconnect.

As used herein, a "computing device" may be a storage array, storage device, storage enclosure, server, desktop or laptop computer, networking device, switch, access point, or any other device or equipment including a controller, a processing resource, or the like. In examples described herein, a "processing resource" may include, for example, one processor or multiple processors included in a single computing device or distributed across multiple computing devices. As used herein, a "processor" or "processing resource" may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof.

As used herein, a "machine-readable storage medium" may be any electronic, magnetic, optical, or other physical storage apparatus to contain or store information such as executable instructions, data, and the like. For example, any machine-readable storage medium described herein may be any of Random Access Memory (RAM), volatile memory, non-volatile memory, flash memory, a storage drive (e.g., a hard drive, hard drive disk (HDD)), a solid state drive, any type of storage disc (e.g., a compact disc, a DVD, etc.), and the like, or a combination thereof. In another example, the machine-readable storage medium may fit into a space on a computing device. The space may be small form factor (SFF) or large form factor (LFF). For example, an SFF HDD may include a 2.5 inch HD or SSD, while an LFF HDD may include a 3.5 inch HD or SSD. Any machine-readable storage medium described herein may be non-transitory.

As used herein, "rack unit" or "U" may refer to the unit of measurement to define the height of a rack frame and the height of the equipment in a rack frame (such as, computing devices). Each rack unit may be equivalent to 44.50 millimeters or 1.75 inches. For example, a computing device, such as a rack server, may have a height of 2 U or 2 rack units (in other words, 89 millimeters or 3.5 inches).

As noted above, FIG. 1 is a block diagram of a male disconnect (e.g., a non-circular male disconnect 100). In such examples the non-circular male disconnect 100 may be obround, an ellipse, or some other non-circular shape. In such examples, the shape of the non-circular male disconnect 100 may increase the flow rate of liquid through a tube or pipe connected to the non-circular male disconnect 100. Further, due to the non-circular shape, the flow rate of the liquid may be increased at a same pressure or a lower pressure than a circular disconnect. For example, for an obround male disconnect, a high flow rate (for example, 18 gallons per minute) may be achieved at a one third of the pressure used for the same flow rate of a circular male disconnect.

In another example, the non-circular male disconnect 100 may be comprised of plastic. In another example, the non-circular male disconnect 100 may be a thermoplastic polymer, such as polyphenylene sulfide (PPS). In another example, the non-circular male disconnect 100 may be comprised of metal. In another example, the male poppet 104 and components of the non-circular female disconnect may be comprised of one of the materials listed above.

In an example, the male poppet 104 of the non-circular male disconnect 100 may correspond to a plunger of the female disconnect. The plunger of the female disconnect may be surrounded by a female poppet. The female poppet may be a ring that moves based on a spring force. For example, as the non-circular male disconnect 100 is inserted into the non-circular female disconnect, the male body 102 may push the female poppet further into the female body. The plunger, which may remain stationary, may push the male poppet 104 further into the male body 102. As the male poppet 104 and female poppet are pushed further into the male body 102 and female body, respectively, liquid may flow from the non-circular male disconnect 100 and around the male poppet 104 to the non-circular female disconnect (In another example, the liquid may flow in the reverse direction). Thus, the non-circular male disconnect 100 (as well as the tube or pipe connected to the non-circular male disconnect) may provide a supply or return of liquid to or from a computing device for cooling or heat removal purposes (as in, cooling of components in a computing device that generate heat, like a processing resource).

Figure 2A:
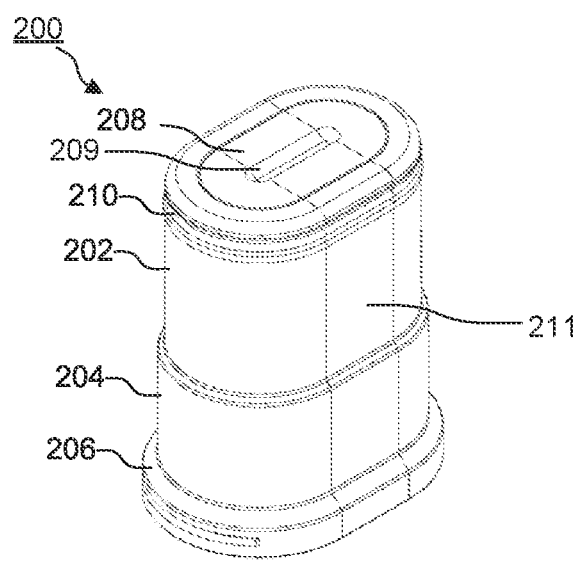
FIGS. 2A-C are schematic views of a non-circular male disconnect, according to an example.
Figure 2B:
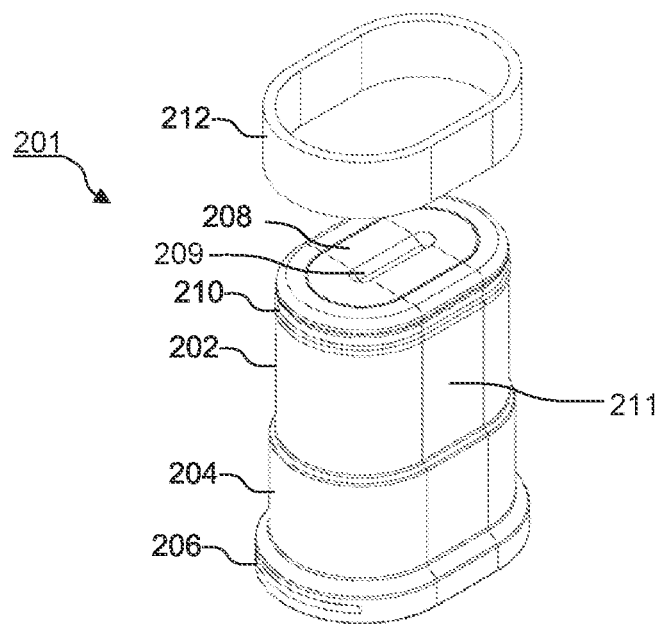
Figure 2C:
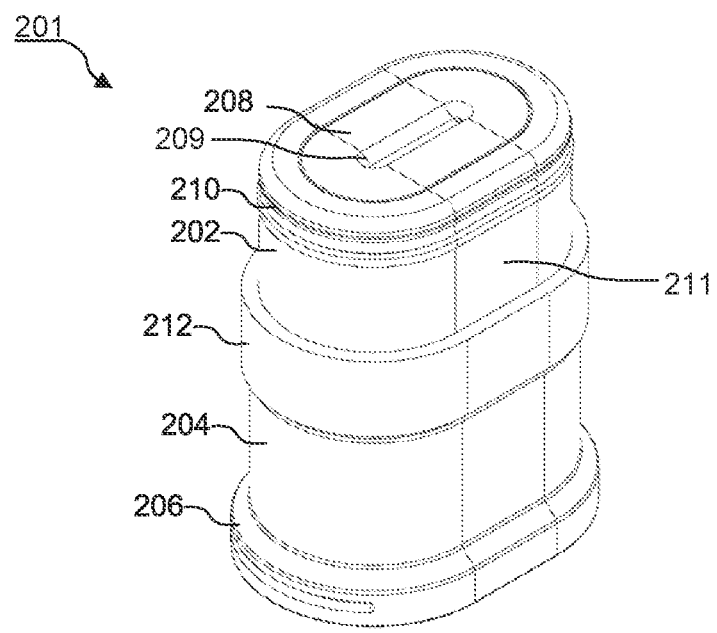

FIGS. 2A-C are schematic views of a non-circular male disconnect 200, 201, according to an example. FIG. 2A is a schematic view of the non-circular male disconnect 200, without a sleeve. In such examples, the non-circular male disconnect 200 may include a base 206, a bottom portion 204, and a top portion 202. The base 206 may be thicker than either the top portion 202 and/or the bottom portion 204. In another example, the base 206 may include tube or pipe retention features on the outside and/or inside of the base 206. In other words, tubes or pipes may connect or attach to the base 206 of the non-circular male disconnect 200 for the purpose of moving liquid to and from a computing device. In another example, the base 206 may include an O-ring or other water-tight seal on the outside or inside, where the tube or pipe may connect, to prevent leakage.

In another example, the bottom portion 204 may be a first uniform thickness. In other words, the bottom portion 204 may measure at the same thickness at any point along the bottom portion 204. In another example, the bottom portion 204 may be thicker than the top portion 202. In another example, the top portion 202 may be a second uniform thickness. In other words, the top portion 202 may measure at the same thickness at any point on the top portion 202. As noted, the first uniform thickness (of the bottom portion 204) may be thicker than the first uniform thickness (of the top portion 202). In another example, the difference in the first uniform thickness and second uniform thickness may be on the outside of the non-circular male disconnect 200 (in other words, the outside of the bottom portion 204 may be thicker than the outside of the top portion 202, while the inside or inner wall of the non-circular male disconnect 200 is smooth from the top portion 202 to the bottom portion 204). In such examples, the non-circular female disconnect may include a stop to prevent over insertion. In another example, an edge of the opening of the non-circular female disconnect may be smaller or less thick than the bottom portion 204 (in other words, the bottom portion 204 may prevent over insertion as the bottom portion 204 may abut an edge of the opening of the non-circular female disconnect when the non-circular male disconnect 200 is fully inserted into the non-circular female disconnect). Further, the bottom portion 204 may be larger than the inner portion or edge of the opening of the non-circular female disconnect.

In another example, the non-circular male disconnect 200 may include a male poppet 208. In an example, the male poppet 208 may be held in place via force or friction. In a further example, the force may be generated by liquid flowing into the non-circular male disconnect 200. In another example, the force may be a spring force. In such examples, a spring or springs (not shown) may be included inside the non-circular male disconnect 200. In a resting state, the spring or springs may be extended and force the male poppet 208 to sit flush or almost flush against the opening of the non-circular male disconnect 200, thus preventing any liquid from escaping the non-circular male disconnect 200. When the non-circular male disconnect 200 is inserted into a non-circular female disconnect, male poppet 208 may be pushed inwards and the spring or springs may compress, thus allowing liquid to flow through the opening in the non-circular male disconnect 200.

In another example, the male poppet 208 may include a notch 209. The notch 209 may correspond to a protrusion on the plunger of the non-circular female disconnect. Thus, as the non-circular male disconnect 200 is inserted into the non-circular female disconnect, the protrusion may fit into the notch 209 and prevent potential misalignment of the non-circular male disconnect 200 (as misalignment may potentially causing leakages). In another example, other alignment features, such as pins or guidance pins (corresponding to apertures on the non-circular female disconnect), may be included on the sides of the non-circular male disconnect 200 and or the male poppet 208.

In another example, the non-circular male disconnect 200 may include a notch 210. In such examples, the notch 210 may accommodate a gasket or O-ring. In such examples, as the non-circular male disconnect 200 is inserted into the non-circular female disconnect, liquid may start flowing through the non-circular male disconnect 200 and the non-circular female disconnect. In such examples, the gasket or O-ring may press against the inside of the non-circular female disconnect, creating a seal and thus preventing leakages.

FIGS. 2B-C are schematic views of the non-circular male disconnect 201, with a sleeve 212. Depending on the material used for a non-circular male disconnect 201, pressure may cause deformation to the wider or flat portion 211 of the non-circular male disconnect 200. In such examples, the amount of pressure to deform the non-circular male disconnect 200 may be more than an operating pressure. In other words, liquid flowing through the non-circular male disconnect 200 to/from an operating computing device may not generate the amount of pressure to deform the non-circular male disconnect. Nevertheless, the non-circular male disconnect 201 may be tested at higher than operating pressure to ensure proper operation in any environment or case. However, if deformation were to occur, the gasket, O-ring, or seal of the non-circular male disconnect may be compromised, potentially causing a leak. To prevent such an issue, a sleeve 212 may be added to the non-circular male disconnect 201. In such examples, the sleeve may be comprised of plastic, metal, carbon fiber, or some other material suitable to prevent the deformation of the non-circular male disconnect 201 under high pressure. In another example, the sleeve 212 and top portion 202 together may form a larger thickness than the bottom portion 204. When the non-circular male disconnect 201 is added to the non-circular female disconnect the sleeve 212 may prevent further insertion, rather than the bottom portion 204.

In another example, the sleeve 212 may be added to the non-circular male disconnect 201 before insertion of the non-circular male disconnect 201 into the non-circular female disconnect (for example, a user may add the sleeve 212 to the non-circular male disconnect 201). In another example, the sleeve 212 may be added to the non-circular male disconnect 201 at the time of manufacturing. In another example, the sleeve 212 may fixedly or removably attached to the non-circular male disconnect 201. In such examples, the sleeve 212 may be fixedly attached to the non-circular male disconnect 201 via adhesive. In another example, the sleeve 212 may be attached via latch or some other similar attachment feature. In another example, the sleeve 212 may stay fixed in place via friction.

In another example, rather than a sleeve 212, the non-circular male disconnect 201 may include support structures along the inside of the wider or flat portion 211. The support structure may be bars that run along the inside of the non-circular male disconnect 201 from the top to the bottom of the entire circular male disconnect 201, the top portion 202, or at some other set of points within the non-circular male disconnect 201. The support structures may be fused or integral to the non-circular male disconnect 201. Further, the male poppet 208 and plunger may not touch or be impeded by the support structures, as the diameter of the male poppet 208 and plunger may be less than the diameter of the non-circular male disconnect 201 and support structures. In a further example, the support structure may include a bridge. The bridge may span the distance between the support structures and may be slidably connected to the support structures. In such examples, as the male poppet 208 is pushed inwards, the bridge may slide down or inwards.

Figure 3A:
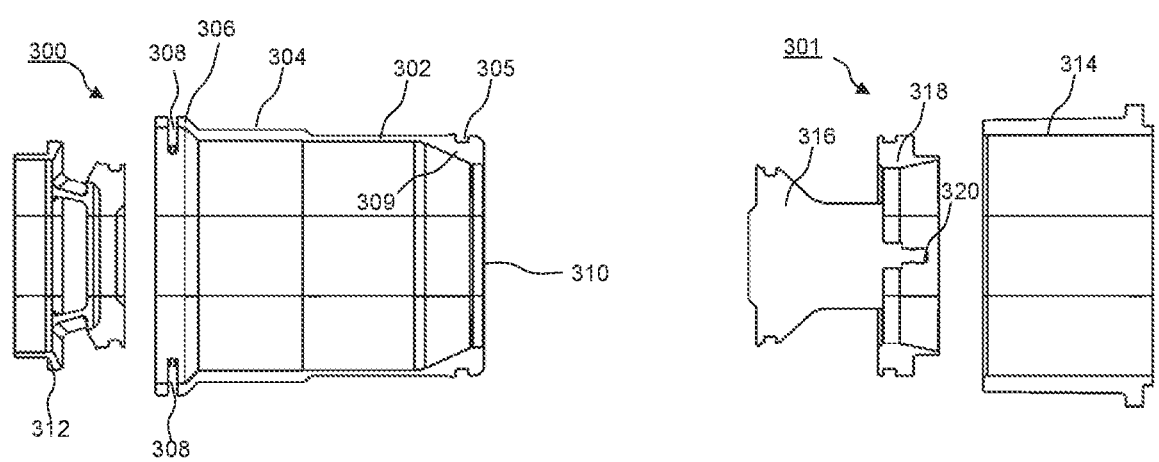
FIGS. 3A-E are schematic views of a non-circular male disconnect and a non-circular female disconnect, according to an example.
Figure 3B:
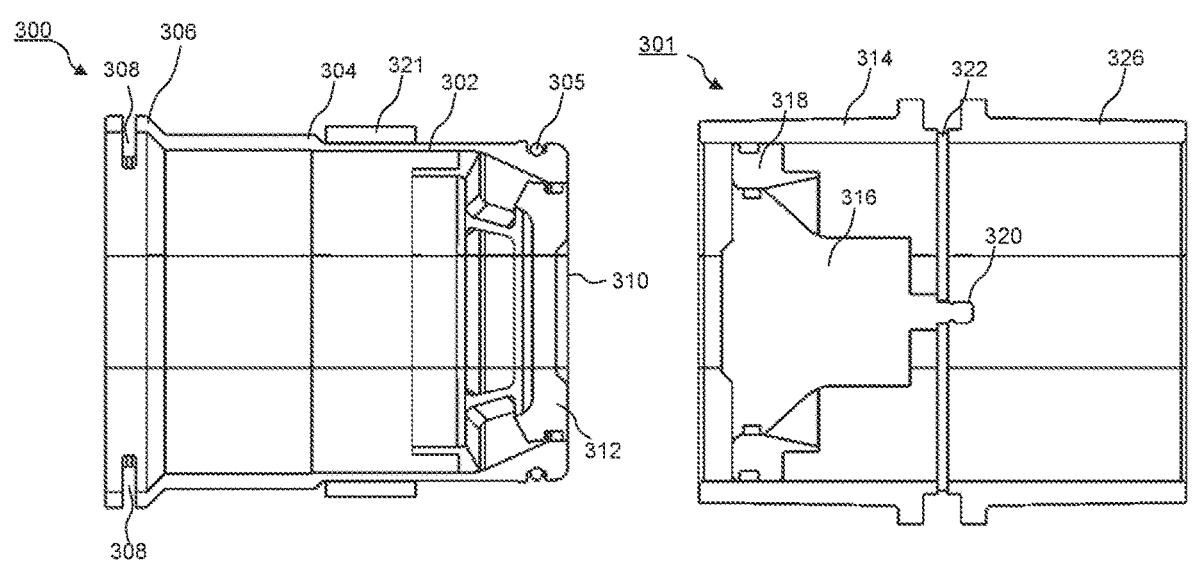

FIGS. 3A-E are schematic views of a non-circular male disconnect 300 and a non-circular female disconnect 301, according to an example. In the following examples, the non-circular male disconnect 300 and a non-circular female disconnect 301 may be obround (as shown), an ellipse, or some other non-circular shape. FIG. 3A is an exploded cross section of the non-circular male disconnect 300 and non-circular female disconnect 301, while FIG. 3B is an assembled cross section of the non-circular male disconnect 300 and non-circular female disconnect 301. As shown, the male poppet 312 may fit into the rear of the non-circular male disconnect 300 (or in other words, through the base 306 of the non-circular male disconnect 300). The male poppet 312 may push against the opening 310 opposite the base 306 of the non-circular male disconnect 300. In other words, prior to insertion into the non-circular female disconnect 301, the male poppet 312 may create a seal against the opening 310, thus preventing leakage. In another example, the force of the liquid pushing against the male poppet 312 may keep the male poppet 312 in place against the opening 310. In another example, a spring or other mechanism may be included to provide a sufficient spring force to keep the male poppet 312 pressed against the opening 310 prior to insertion to prevent leakage.

In another example, the non-circular male disconnect may include a top portion 302, a bottom portion 304, and a base 306. In such examples, the bottom portion 304 may be a first uniform thickness and the top portion 302 may be a second uniform thickness. In an example, the first uniform thickness may be greater than the second uniform thickness. In another example, the top portion 302 may flare inwards at the opening 310. In such examples, the flared portion 309 may prevent the male poppet 312 from passing through the opening 310. In another example, the base 306 may include notches 308 to allow for a tube or pipe to attach or connect to the non-circular male disconnect 300. In another example, a notch 305 may be included on the top portion 302 near the opening 310. In such examples, the notch 305 may allow for a gasket or O-ring, to create a seal on the inside of the female body 314 of the non-circular female disconnect 301, to prevent leakage.

In another example, the non-circular female disconnect 301 may include a plunger 316 and a female poppet 318. In such examples, the plunger 316 may be stationary. Further, the smaller end 320 of the plunger 316 may fit into a stationary portion 322 of the non-circular female disconnect 301 or into an insert in the mounting features of the non-circular female disconnect 301 (Shown in FIGS. 3B, 3C, and 3D). In another example, before insertion of a non-circular male disconnect 300, the female poppet 318 may press against an opening of the non-circular female disconnect 301. In such examples, liquid may force the female poppet 318 to press against the opening. In another example, a spring (not shown), springs. or other similar mechanism may force the female poppet 318 to push against the opening. In a further example, when the non-circular male disconnect 300 is not inserted into the non-circular female disconnect 301, the spring or springs in the non-circular female disconnect 301 may be extended. When the non-circular male disconnect 300 is inserted into the non-circular female disconnect 301, the female poppet 318 may be pushed inwards or into the non-circular female disconnect 301, thus compressing the spring or springs.

In another example, liquid may flow from the non-circular male disconnect 300 to the non-circular female disconnect 301. In such examples, the liquid flowing in such a direction may be cold, cool, or room temperature. In another example, liquid may flow from the non-circular female disconnect 301 to the non-circular male disconnect 300. In such examples, the liquid may be heated, hot, or warm.

Figure 3C:
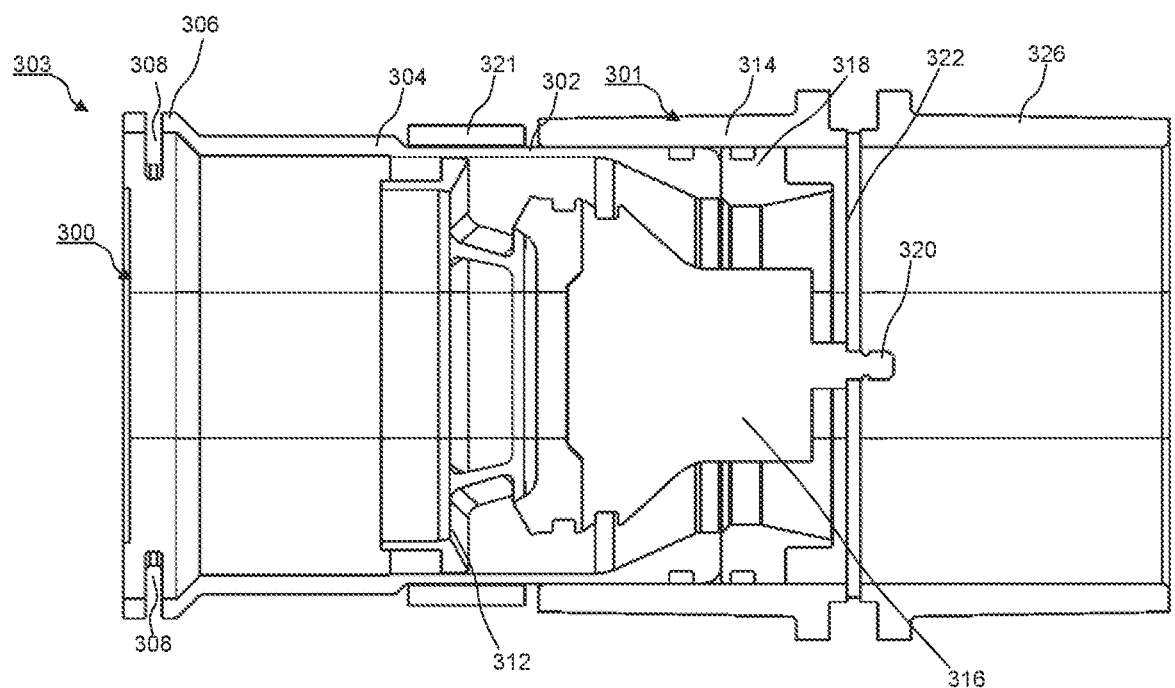

FIG. 3C is a cross-section of a non-circular male disconnect 300 inserted into a non-circular female disconnect 301. As noted, a smaller end 320 of the plunger 316 may connect to a stationary portion 322 or wall. The stationary portion 322 or wall may fit in between the non-circular female disconnect 301 and a disconnect 326. Further disconnect 326 may connect to tube or pipes internal to a computing device.

As noted, the sleeve 321 may prevent over insertion of the non-circular male disconnect 300. In another example, the bottom portion 304 may prevent over insertion of the non-circular male disconnect 300. In another example, the female poppet 318 may press against the stationary portion 322 or wall and prevent further insertion of the non-circular male disconnect 300 into the non-circular female disconnect 301. In another example, the non-circular female disconnect 301 may include a latch or other toolless mechanism to connect to corresponding features on the non-circular male disconnect 300. In such examples, the latch or other toolless mechanism may lock the non-circular male disconnect 300 in place.

Figure 3D:
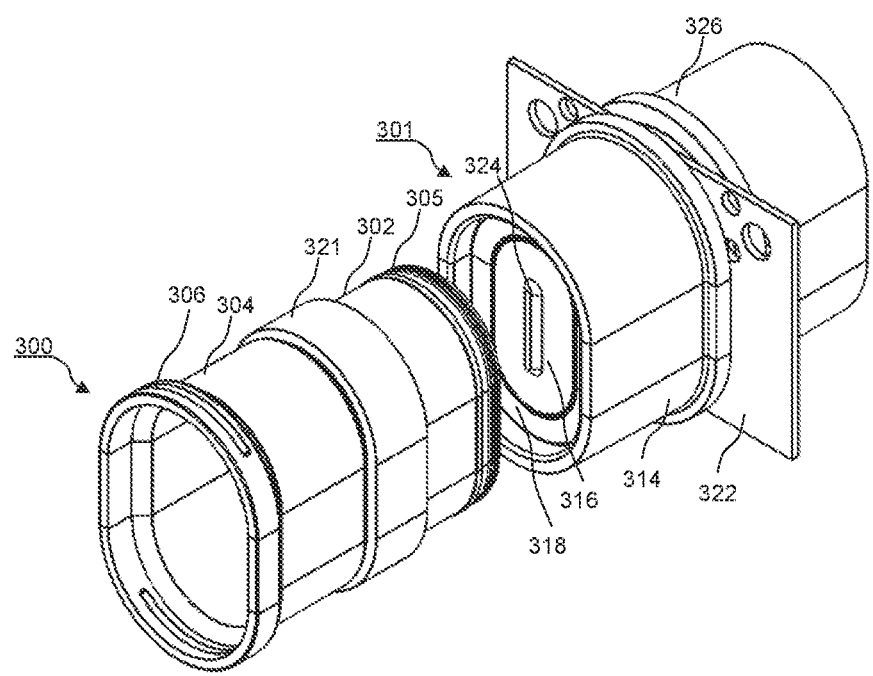
Figure 3E:
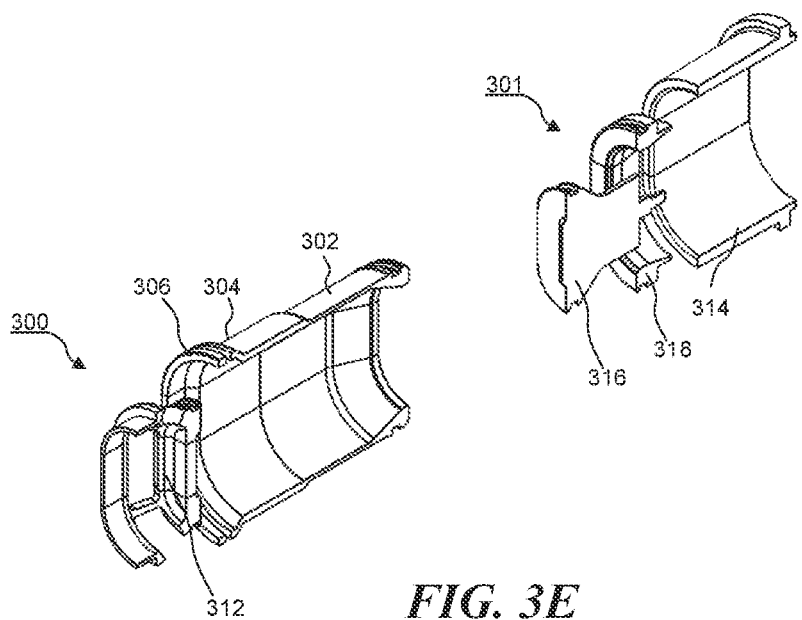
Figure 4A:
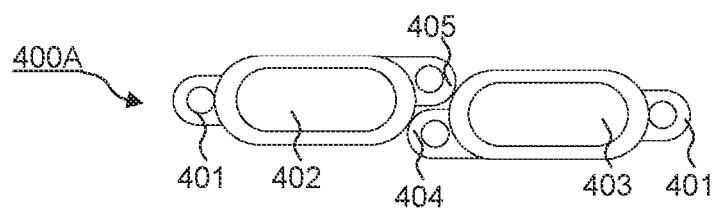
FIGS. 4A-D are schematic views of non-circular disconnect mounts, according to an example.

FIGS. 3D and 3E are another schematic view of the non-circular male disconnect 300 and the non-circular female disconnect 301. As noted above, the non-circular male disconnect 300 may include a male body comprised of the top portion 302, the bottom portion 304, and the base 306. In another example, the non-circular male disconnect 300 may include a sleeve 321, a notch 305 for a gasket (or an O-ring or seal), and a male poppet 312. As noted above, the non-circular female disconnect 301 may include a female body 314, female poppet 318, and a plunger 316. As noted above, the plunger 316 may connect to a stationary portion 322 or wall. In such examples, the stationary portion 322 or wall may be a mounting component included on the faceplate or other area of a computing device. In such examples, the non-circular female disconnect 301 may be on the side that connects with the non-circular male disconnect 300, while another disconnect 326 may be connected on the other side, to connect tubes or pipes internal to the computing device and to provide liquid to the computing device.

In another example, the male poppet 312 may be a ring, obround, ellipse, or other shape with a solid top, to prevent water flow when pressed against the opening 310 of the non-circular male disconnect 300. In another example, the plunger 316 may be a solid component which pushes the male poppet 312 back, allowing for water to flow through the non-circular male disconnect 300 and around the plunger 316 and male poppet 312. In another example, the male poppet 312 may include a notch. In a further example, the plunger 316 may include a corresponding feature, for example, protrusion 324. In a further example, the notch may include a magnet. Further, the protrusion 324 may be magnetized or include a magnet corresponding to the magnet in the notch. In such examples, the magnets in the notch and protrusion 324 may allow for self-centering or self-alignment of the non-circular male disconnect 300 within the non-circular female disconnect 301. In another example, the portion of the non-circular male disconnect 300 around opening 310 may be magnetized or include magnets. Further, the female poppet 318 may be magnetized or include magnets. In such examples, as the non-circular male disconnect 300 is inserted into the non-circular female disconnect 301, the magnets in or magnetized surface of the portion surrounding opening 310 may magnetically connect to magnets in or magnetized surface of the female poppet 318 to self-center or self-align the non-circular male disconnect 300 within the non-circular female disconnect 301.

Figure 4B:
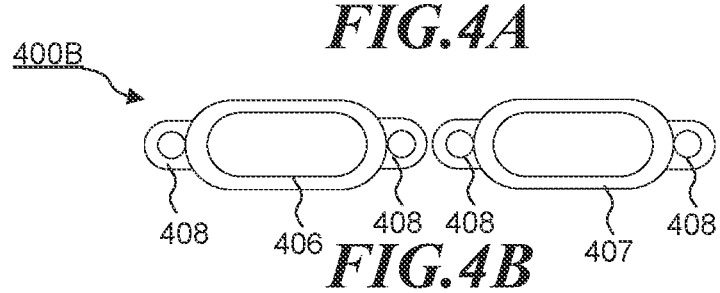
Figure 4C:
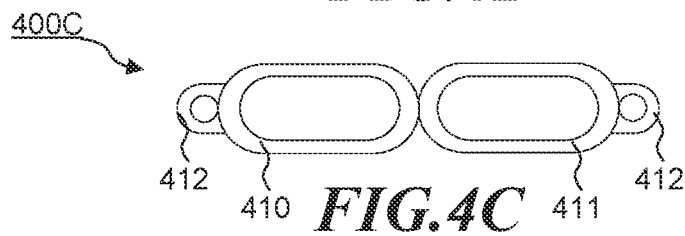
Figure 4D:
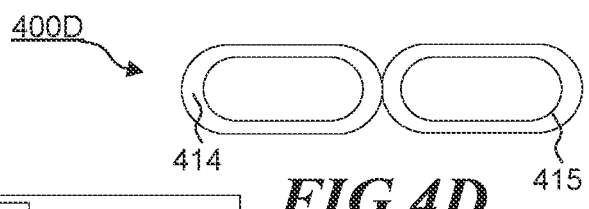

FIGS. 4A-D are schematic views of non-circular disconnect mounts, according to an example. In an example, the application of the non-circular disconnects may allow for liquid disconnects to be placed in smaller spaces. Further, as disconnects for a cold supply line and a hot return line may be utilized, the mounting features may be laid out on a computing device in various configurations (for example, to maximize space). For example, in FIG. 4A two disconnect mounts 402, 403 are shown. In such examples, the disconnect mounts 402, 403 may be positioned close together. Further, one disconnect mount 402 may include an aperture 401 centered at one edge of disconnect mount 402, while another aperture 405 may be positioned such that another aperture 404 on another disconnect mount 403 may fit underneath. Such a configuration may allow for disconnect mounts to fit closely together, thus maximizing space, while allowing for secure retention or alignment features (for example, utilizing the apertures) for each non-circular disconnect. In another example, rather than including apertures 401, 404, 405, the two disconnect mounts 402, 403 may include pins or guidance pins corresponding to alignment features included on a non-circular male disconnect. In FIG. 4B, each aperture 408 may be centered along both edges of each disconnect mount 406 407. Such a configuration, while not maximizing space, may allow for the use of non-custom disconnect mounts. In another example, rather than including apertures 408 the two disconnect mounts 406, 407 may include pins or guidance pins corresponding to alignment features included on a non-circular male disconnect In FIG. 4C, each disconnect mount 410, 411 may include one aperture 412 at opposite edges. In such examples, the disconnect mounts 410, 411 may be molded, machined, or 3D printed as one piece or one disconnect mount. Such a configuration may maximize the overall structural integrity of the disconnect mounts 410, 411. In FIG. 4D, no apertures may be included with the disconnect mounts 414, 415. In such examples, a non-circular disconnect may utilize a retention clip to fasten or attach each non-circular disconnect to the disconnect mounts 414, 415.

Figure 5:
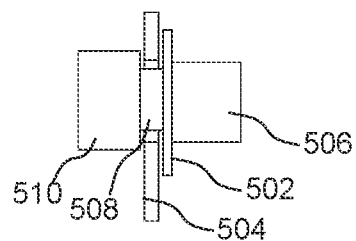
FIG. 5 is a schematic view of a non-circular disconnect mounting configuration, according to an example.

FIG. 5 is a schematic view of a non-circular disconnect mounting configuration, according to an example. For a non-circular disconnect, threaded mounting configurations may not be utilized. To enable the use of non-circular disconnects, different mounting methods may be utilized. For example, a retention clip 502 may be utilized. In such examples, a disconnect 510 internal to a computing device may connect via tube 508 or other connector feature to a non-circular female disconnect 506. In such examples a retention clip 502 may be utilized to secure the disconnect 510, tube 508, and non-circular female disconnect 506 to a panel, faceplate, or bulkhead 504 of a computing device.

Figure 6A:
FIGS. 6A-C are block diagrams of non-circular disconnect mount layouts, according to an example.
Figure 6B:
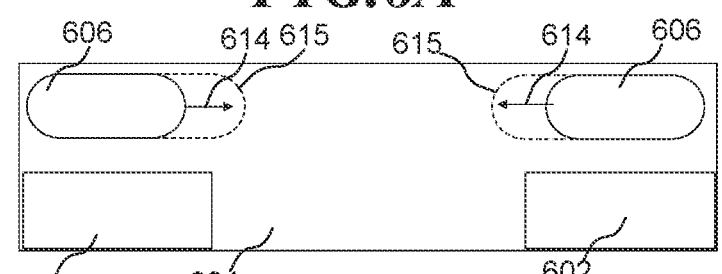
Figure 6C:
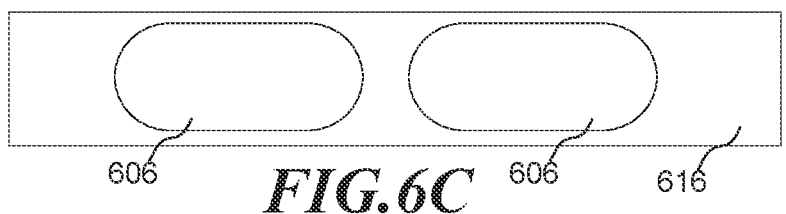

FIGS. 6A-C are block diagrams of non-circular disconnect mount 606 layouts, according to an example. In FIG. 6A, the non-circular disconnect mounts 606 may be placed one on top of the other on the computing devices faceplate or bulkhead 604. In such an example, the computing devices faceplate or bulkhead 604 may include other components, such as handles 602. In such an example, a round or circular disconnect may not fit over the handles and may be placed at an offset between the handles 602 to fit on the computing devices faceplate or bulkhead 604. In another example, the computing device may be a 1 U computing device. In another example, the computing device may be larger or smaller than a 1 U computing device. In FIG. 6B, ad as noted, a computing devices faceplate or bulkhead 604 may include various components, such as the handles 602. In such examples, while round or circular disconnects may not fit above the handles 602, other non-circular disconnect mounts 606 may fit. Further, if flow rate per pressure is to be increased, the non-circular disconnect mounts may be expanded out in the direction of arrows 614 to the dotted lines 615 or further. In other words, the non-circular disconnect mounts 606 may be increased in area to allow for a higher flow rate at a lower pressure. In FIG. 6C, non-circular disconnect mounts 606 may be disposed on a much smaller area. In such examples, the non-circular disconnect mounts 606 may be disposed on a faceplate or bulkhead 616 the size of an HDD (for example, an SFF HDD or LFF HDD space), a PCI (peripheral component interconnect) or PCIe (peripheral component interconnect express) device space, or other similarly sized device spaces. In such examples, space on the bulkhead or faceplate of the computing device may not be available for disconnect mounts. However, disconnect mounts may be disposed on a device the size of an HDD or other similarly sized devices. However, round or circular disconnect mounts may not fit. The non-circular disconnect mounts 606 may fit, due to the lower height of the non-circular disconnect mounts 606, and offer increased flow rate per pressure, due to the increased overall area of the non-circular disconnect mounts 606. In other words, non-circular disconnect mounts 606 (and the corresponding non-circular male and female disconnects) may be shorter in height but larger in overall area, due to an increased length or width. Further, a user may replace an HDD or other similarly sized device with a device or blank including the non-circular disconnect mounts 606 to enable a computing device to utilize liquid cooling.

FIGS. 7A-D are schematic views of ganged disconnects, according to an example. In an example, to achieve sufficient flow rate at smaller sized disconnects, rather than utilizing a non-circular disconnect (e.g., obround), two or more ganged circular disconnects may be utilized and, when joined or fused, may occupy an obround volume or area. The ganged circular disconnects may be molded as one component for liquid flowing in a single direction (in other words two or more circular disconnects for return liquid or supply liquid).

In such examples, the ganged circular disconnects may provide greater efficiency in a smaller or more efficient space than a single circular disconnect. For example, to achieve a higher flow rate at a lower pressure, two or more standard liquid disconnects may be ganged, fused, or joined. Thus, flow rate is increased at a lower pressure, while maintaining a standard height for the ganged circular disconnects. In another example, this effect may be achieved by decreasing the area of each circular disconnect of the two or more ganged circular disconnects Thus, while the area of each circular disconnect is smaller, the overall area may be increased as the two or more ganged circular disconnects are connected to a common fluid path. Such an example may allow for the two or more ganged circular disconnects to fit into smaller than normal areas.

Figure 7A:
Figure 7B:
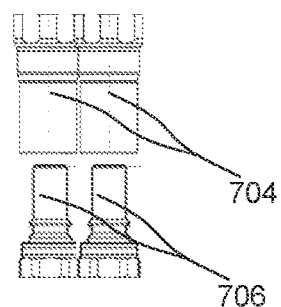
Figure 7D:
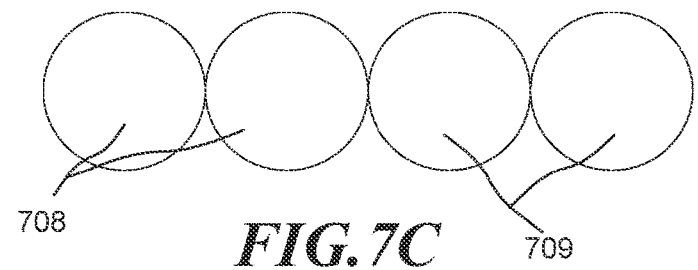
Figure 7D:
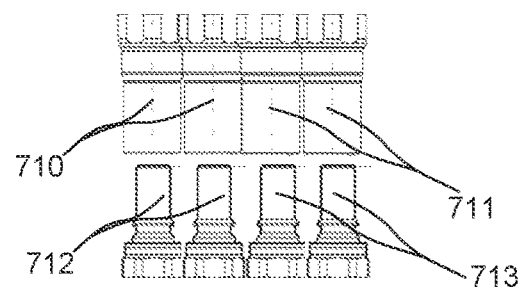

For example, in FIGS. 7A and 7B, two disconnect mounts 702 may allow for the flow of either hot or cold liquid. In other words, the two disconnect mounts 702 may work as one disconnect mount. In such an example, the diameter of the opening of the ganged male disconnects 706 may be reduced, while maintaining a sufficient flow rate. As noted above, the ganged male disconnects 706 and corresponding ganged female disconnects 704 may each be molded as one disconnect (male and female, respectively). In another example, the ganged male disconnects 706 may share a common fluid path.

In another example, more circular disconnects may be ganged together. In another example, supply disconnects and return disconnects may be ganged together. For example, in FIGS. 7C and 7D, two disconnect mounts 708 may allow for the flow of either hot or cold liquid, while the other two disconnect mounts 709 may allow for the flow of liquid opposite that of the two disconnect mounts 708. In such examples, two adjacent ganged male disconnects 712 and corresponding ganged female disconnects 710 may form a supply while the other two ganged male disconnects 713 and corresponding ganged female disconnects 711 may form a return, or vice versa. In such examples, the entire set of disconnects 700B, 700D may be fused together or molded as one piece.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be examples. Structure and acts described herein are replaceable by equivalents, which perform the same function, even if the structure or acts are different, as known in the art. Therefore, the scope of the present disclosure is limited only by the elements and limitations as used in the claims

What is claimed is:
1. A system, comprising:
a panel including an aperture;
a non-circular female disconnect to fit through the aperture; and
a non-circular male disconnect comprising:
a male body defining a first liquid channel having a non-circular cross-section, the male body configured to be inserted into the non-circular female disconnect comprising a female body defining a second liquid channel having a non-circular cross-section; and
a male poppet in the first liquid channel,
wherein when the non-circular male disconnect is inserted into the non-circular female disconnect, the male poppet is pushed away from a first opening of the male body by a plunger in the non-circular female disconnect to open the first opening and allow for coolant to flow:
a) from the non-circular male disconnect to the system through the non-circular female disconnect or b) from the system to the non-circular male disconnect through the non-circular female disconnect, and wherein the non-circular female disconnect is held in place via a retention clip.

2. The system of claim 1, wherein the system includes at least two non-circular female disconnects for coolant entering the system and heated coolant leaving the system.

3. The system of claim 1, wherein the non-circular shape of the non-circular female disconnect allows for higher flow rate of the coolant at a same pressure or a lower pressure than a circular male disconnect.

4. The system of claim 1, wherein the first liquid channel has an obround cross-section.

5. The system of claim 1, wherein the first liquid channel has an elliptical cross-section.

6. The system of claim 1, wherein each of the non-circular male and female disconnects is comprised of plastic.

7. The system of claim 1, wherein the non-circular male disconnect comprises a magnet corresponding to a magnet included in the non-circular female disconnect to ensure alignment upon insertion.

8. The system of claim 1, wherein the male body has a non-circular cross-section at the first opening, and wherein the male poppet has a non-circular cross-section.

9. The system of claim 1, wherein the first opening has a non-circular cross-section.

10. The system of claim 1, wherein the panel is included on a slot utilized for a peripheral device.

11. The system of claim 10, wherein the slot is a small form factor (SFF) slot or large form factor (LFF) slot.

12. The system of claim 1, wherein the male body comprises an outer circumferential surface and an inner circumferential surface defining the first liquid channel, the inner circumferential surface having a non-circular cross-section.

13. The system of claim 12, wherein the outer circumferential surface has a non-circular cross-section.

14. The system of claim 1, wherein the non-circular female disconnect comprises a female poppet disposed within the second liquid channel and circumferentially surrounding the plunger, and wherein in a state of the non-circular male disconnect not being inserted into the non-circular female disconnect, a radially outer portion of the female poppet engages the female body and a radially inner portion of the female poppet engages the plunger to close a second opening in the female body, the second opening connecting to the second liquid channel.

15. The system of claim 14, wherein the male body comprises an end portion defining the first opening and comprising a rim around the first opening; and wherein, as the non-circular male disconnect is inserted into the non-circular female disconnect:
    the rim of the end portion of the male body is received within the second opening and displaces the female poppet to open the second opening, and
    the plunger is received within the first opening and displaces the male poppet to open the first opening.

16. The system of claim 15, wherein, in an inserted state of the non-circular male disconnect in the non-circular female disconnect:
    the end portion of the male body is inserted into the female body and creates a seal with an inner surface of the female body, and
    the first liquid channel and the second liquid channel are connected via the first opening and the second opening.

17. The system of claim 1, wherein the male body includes a bottom portion of a first uniform thickness and having a non-circular cross-section and a top portion of a second uniform thickness and having a non-circular cross-section.

18. The system of claim 17, further comprising a sleeve fitted over the top portion to prevent deformation of the male body, and wherein the sleeve is comprised of non-plastic material.

19. The system of claim 17, wherein the first uniform thickness is larger than the second uniform thickness.

20. The system of claim 19, wherein the top portion inserts into the non-circular female disconnect, and wherein the bottom portion prevents further insertion into the non-circular female disconnect.

\* \* \* \* \*